US012641714B2

(12) United States Patent
Ho et al.

(10) Patent No.: US 12,641,714 B2
(45) Date of Patent: May 26, 2026

(54) PACKAGE CAPABLE OF ELIMINATING BUBBLE FORMATION

(71) Applicant: PANJIT INTERNATIONAL INC., Kaohsiung City (TW)

(72) Inventors: Chung-Hsiung Ho, Kaohsiung City (TW); Chi-Hsueh Li, Tainan City (TW); Wei-Ting Chen, Taipei City (TW)

(73) Assignee: PANJIT INTERNATIONAL INC., Kaohsiung City (TW)

( * ) Notice: Subject to any disclaimer, the term of this patent is extended or adjusted under 35 U.S.C. 154(b) by 410 days.

(21) Appl. No.: 18/393,714

(22) Filed: Dec. 22, 2023

(65) Prior Publication Data

US 2025/0120008 A1     Apr. 10, 2025

(30) Foreign Application Priority Data

Oct. 4, 2023     (TW) ................................. 112138043

(51) Int. Cl.
| | |
|---|---|
| *H05K 1/02* | (2006.01) |
| *H05K 1/05* | (2006.01) |
| *H05K 1/11* | (2006.01) |
| *H05K 3/00* | (2006.01) |

(52) U.S. Cl.
CPC ............. *H05K 1/0271* (2013.01); *H05K 1/05* (2013.01); *H05K 1/115* (2013.01); *H05K 3/0094* (2013.01); *H05K 2201/0753* (2013.01)

(58) Field of Classification Search
CPC ........ H05K 1/0271; H05K 1/05; H05K 1/115; H05K 3/0094; H05K 2201/0753; H05K 1/00; H05K 1/02

USPC ......................... 174/255, 256, 260, 261, 258
See application file for complete search history.

(56) References Cited

U.S. PATENT DOCUMENTS

| | | | | |
|---|---|---|---|---|
| 6,392,301 B1 * | 5/2002 | Waizman | ............. | H05K 1/0253 |
| | | | | 174/266 |
| 6,909,054 B2 * | 6/2005 | Sakamoto | ............. | H05K 1/185 |
| | | | | 257/E23.178 |
| 7,855,342 B2 * | 12/2010 | Sakamoto | ............. | H10W 70/65 |
| | | | | 174/260 |
| 8,237,060 B2 * | 8/2012 | Tanaka | ................... | H05K 1/185 |
| | | | | 174/260 |
| 8,294,036 B2 * | 10/2012 | Kakei | ................... | H05K 1/162 |
| | | | | 174/260 |
| 8,963,019 B2 * | 2/2015 | Yu | .......................... | H05K 3/381 |
| | | | | 174/262 |

(Continued)

*Primary Examiner* — Angel R Estrada
(74) *Attorney, Agent, or Firm* — Apex Juris, pllc; Cera Oh

(57) ABSTRACT

A package capable of eliminating bubble formation includes a composite substrate having an accommodating space, an upper conductive layer and a lower conductive layer; at least one conductive via formed in the composite substrate and electrically connected to the upper conductive layer and the lower conductive layer; a die mounted in the accommodating space and having a first surface and a second surface; a molding layer covering the composite substrate and filled in the at least one conductive via and the accommodating space to wrap the die; the support layer buried in the molding layer and located above the upper conductive layer; a redistribution layer mounted on the molding layer and electrically connected to the first surface of the die and the upper conductive layer; wherein the molding layer is formed by laminating a first insulating sheet and a second insulating sheet.

11 Claims, 26 Drawing Sheets

(56)            References Cited

U.S. PATENT DOCUMENTS 9,460,990 B1 *  10/2016  Sung ................... H05K 3/4015

* cited by examiner

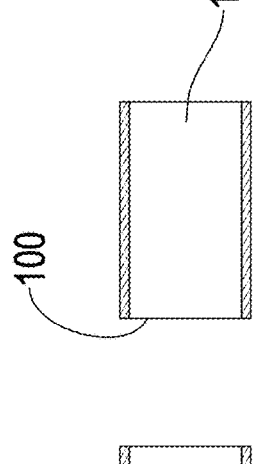
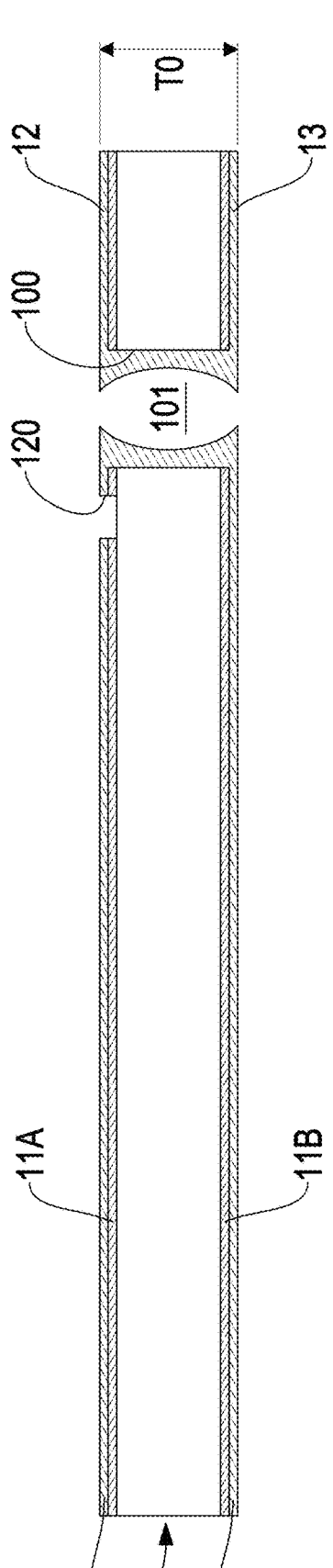
FIG.3A
FIG.3B

PACKAGE CAPABLE OF ELIMINATING BUBBLE FORMATION

CROSS REFERENCE TO RELATED APPLICATIONS

The present application claims priority to Taiwan application No. 112138043, filed on Oct. 4, 2023, the content of which is hereby incorporated by reference in its entirety.

BACKGROUND OF THE INVENTION

1. Field of the Invention

The present invention relates to a package, and more particularly to a package that can eliminate formation of bubbles during packaging process.

2. Description of the Related Art

Conventional printed circuit boards (PCBs) are usually formed from a copper clad laminate (CCL) through multiple processes. The multiple processes include, for example, a drilling process, a deposition process, a lamination process, etc. Wherein, a die can also be buried in the copper clad laminate to form a package. Referring to FIG. 4, a package 7 includes a copper clad laminate 70. A first metal layer 71 and a second metal layer 72 are formed on an upper surface and a lower surface of copper clad laminate 70 respectively, and the copper clad laminate 70 has a through hole 73 and an accommodating space 74. A metal (such as copper) is deposited in the through hole 73 to form a conductive pillar 730, and the conductive pillar 730 is adapted to be electrically connected to the first metal layer 71 and the second metal layer 72. The accommodating space 74 is adapted to place a die 80 and is filled with an insulator 75.

However, during the deposition process of forming the conductive pillar 730, a deposition rate at which the metal deposits at both openings of the through hole 73 is faster than a deposition rate at which the metal deposits inside the through hole 73. Due to the different deposition rates, the metal often wraps air, such that at least one bubble may exist in the conductive pillar 730. When the package 7 undergoes subsequent reliability testing, such as a temperature cycling test (TCT), the at least one bubble will generate an air pressure due to thermal expansion and contraction, and the air pressure causes the conductive pillar 730 to break and affects the electrical connection between the first metal layer 71 and the second metal layer 72.

In addition, during the process of filling the insulator 75 into the accommodating space 74, as the amount of the insulator 75 is often insufficient, the accommodating space 74 adjacent to a periphery of the die 80 is not fully filled with the insulator 75 and has at least one bubble. The at least one bubble will become an arcing path, which may cause a first surface 81 and a second surface 82 of the die 80 to conduct electricity with each other and be short-circuited when the die 80 operates at a high voltage. The arcing path even causes the first metal layer 71 and the second metal layer 72 to conduct electricity with each other and be short-circuited. Therefore, how to reduce bubbles in the package containing a copper clad laminate is an issue that needs to be improved in the conventional printed circuit board manufacturing process.

SUMMARY OF THE INVENTION

To overcome the aforementioned issue, the present invention provides a package that can eliminate bubble formation.

The present invention reduces bubbles formed during packaging processes and overcomes the problem of product reliability caused by bubbles.

In order to achieve the aforementioned objectives, the package of the present invention includes:

a composite substrate having an accommodating space; wherein a top surface and a bottom surface of the composite substrate respectively have an upper conductive layer and a lower conductive layer;

at least one conductive via formed in the composite substrate and electrically connected to the upper conductive layer and the lower conductive layer;

a die mounted in the accommodating space and having a first surface and a second surface opposite to each other;

a molding layer covering the composite substrate and filled in the at least one conductive via and the accommodating space to wrap the die; a support layer buried in the molding layer and located above the upper conductive layer, wherein a thickness of the support layer is at least 10 micrometers;

a part of the molding layer between a bottom surface of the support layer and the upper conductive layer is defined as a first interval layer;

another part of the molding layer between a top surface of the support layer and a top surface of the molding layer is defined as a second interval layer; and a thickness of each of the first interval layer and the second interval layer is at least 5 micrometers; and a redistribution layer is mounted on the molding layer electrically connected to the first surface of the die and the upper conductive layer;

wherein the molding layer is formed by laminating a first insulating sheet and a second insulating sheet; the support layer is comprised in the second insulating sheet; and the first insulating sheet and the second insulating sheet are heated to a semi-curing state to flow into and fill the at least one conductive via and the accommodating space.

During a process of forming the at least one conductive via, a metal deposition time is controlled to make two openings at two ends of the at least one conductive via remain unsealed. Compared with the package in the related art, the package of the present invention does not form a conductive pillar but forms the at least one conductive via, and the at least one conductive via is filled with the molding layer, thereby reducing bubbles formed by inconsistent metal deposition rates during processes. When undergoing subsequent reliability testing, the present invention overcomes the air pressure issue caused by bubble formation in the related art, increasing the product reliability.

Moreover, during packaging processes of the package of the present invention, a step of setting the first insulating sheet is added. The first insulating sheet can be heat-melted to provide a sufficient amount of a first insulating material to fill the accommodating space and wrap the die, eliminating the formation of bubbles adjacent to a periphery of the die and reducing arcing phenomenon, and thereby stabilizing an electrical performance of the die of the present invention. During a lamination process, a sufficient amount of the first insulating material not only fills the at least one conductive via and the accommodating space, but also forms the first interval layer with a thickness on the upper conductive layer. The first interval layer has a sufficient thickness (greater than or equal to 5 micrometers) and is located at a bottom of the support layer, so that the second insulating material, originally located on a top of the support layer, can still remain, after heat-melted, on the top of the support layer to form the second interval layer.

Furthermore, in a situation where a sufficient thickness exists between the upper conductive layer and the connecting metal layer, when a high voltage is applied on the upper conductive layer or the connecting metal layer, the sufficient thickness can reduce occurrences of arc breakdown.

DETAILED DESCRIPTION OF THE INVENTION

In order to understand the technical characteristics and practical effects of the prevent invention in detail, and accomplish them according to the content of the invention, the detailed description is as follows with the embodiments shown in the figures.

The present invention is a package that eliminates bubble formation, and its packaging processes are also disclosed. Wherein the package can be a Panel-Level-Package (PLP) component. The Panel-Level-Package process refers to a process that uses a substrate as a carrier to package one (or more) die that has completed a production of integrated circuits. The package and packaging processes of the present invention are described with figures below.

Figure 1:
FIG. 1 is a cross-sectional view of a composite substrate of the package of the present invention.

FIG. 1 is a cross-sectional view of a composite substrate 10. The composite substrate 10 includes a base layer 11, an upper metal sheet 11A formed on a top surface of the base layer 11, and a lower metal sheet 11B formed on a bottom surface of the base layer 11. For example, the composite substrate 10 can be a copper clad laminate (CCL), that is, the upper metal sheet 11A and the lower metal sheet 11B are respectively a copper foil, and a material of the base layer 11 can be BT resin (bismaleimide triazine resin).

Figures 2A, 2B:
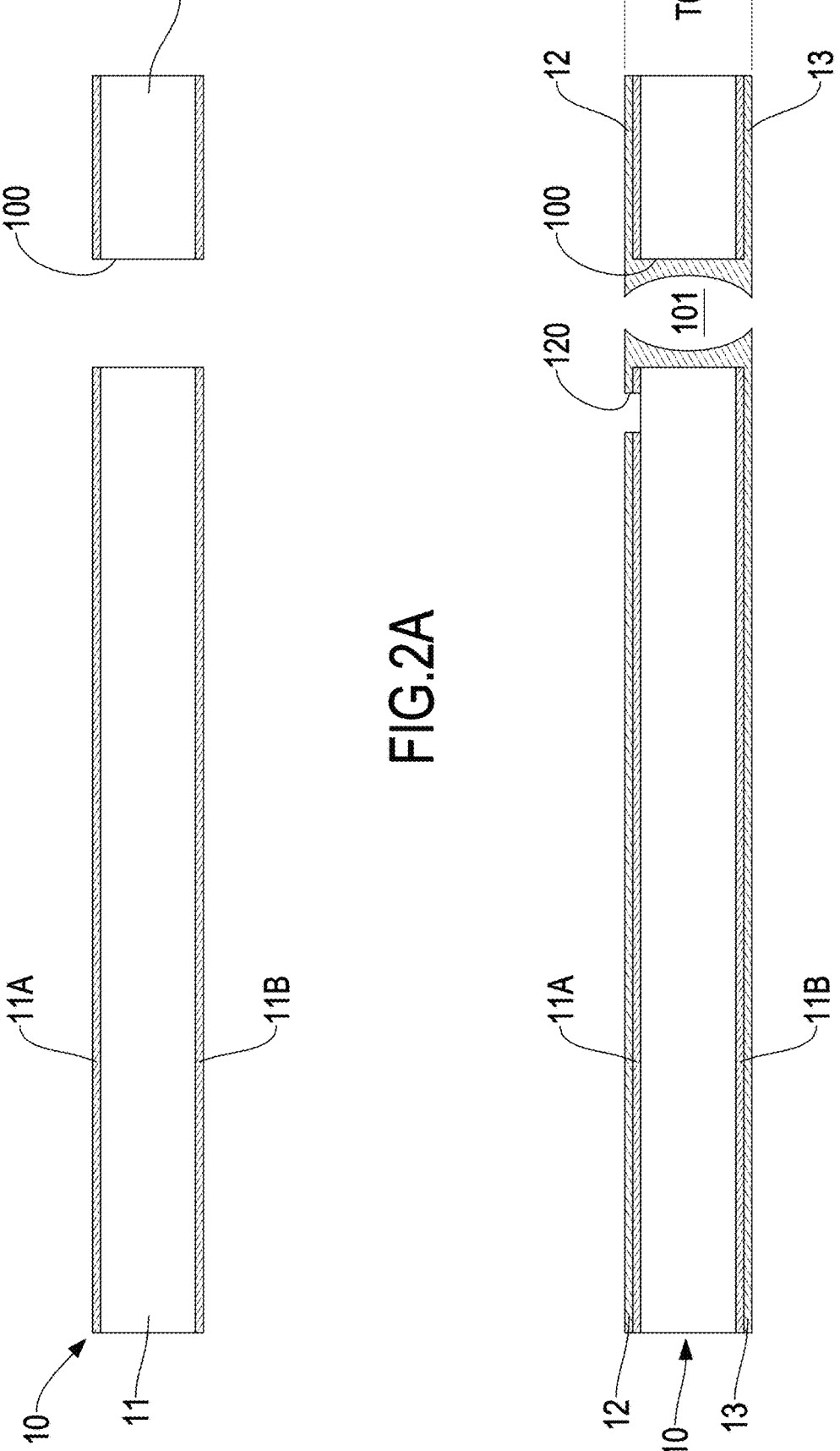
FIGS. 2A to 2N are schematic views of packaging processes of a first embodiment of the package of the present invention.
Figure 2C:
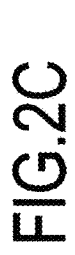
Figure 2C:
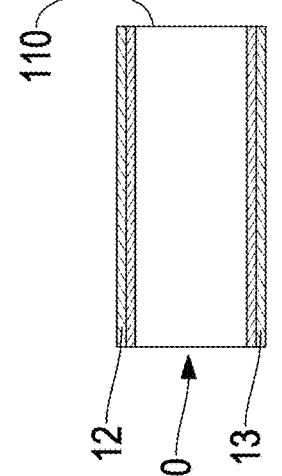
Figure 2D:
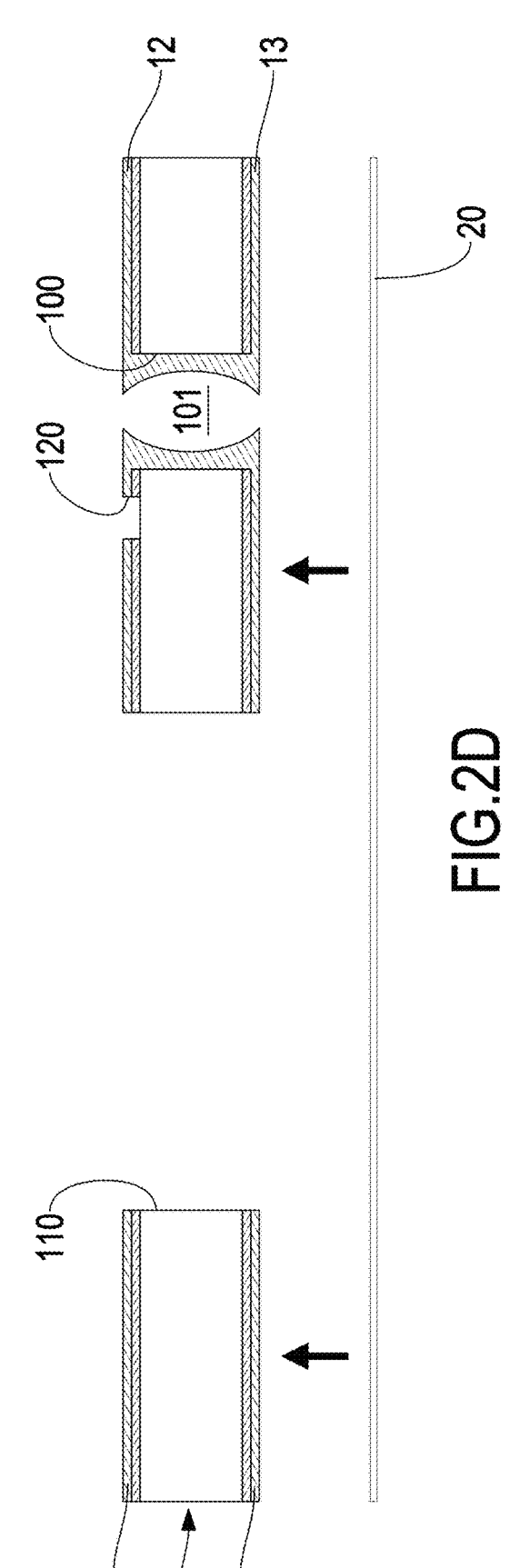
Figure 2D:
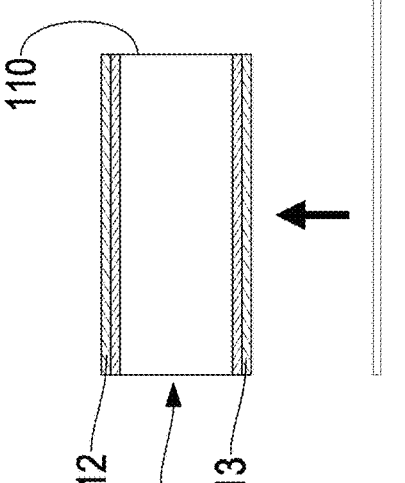
Figure 2E:
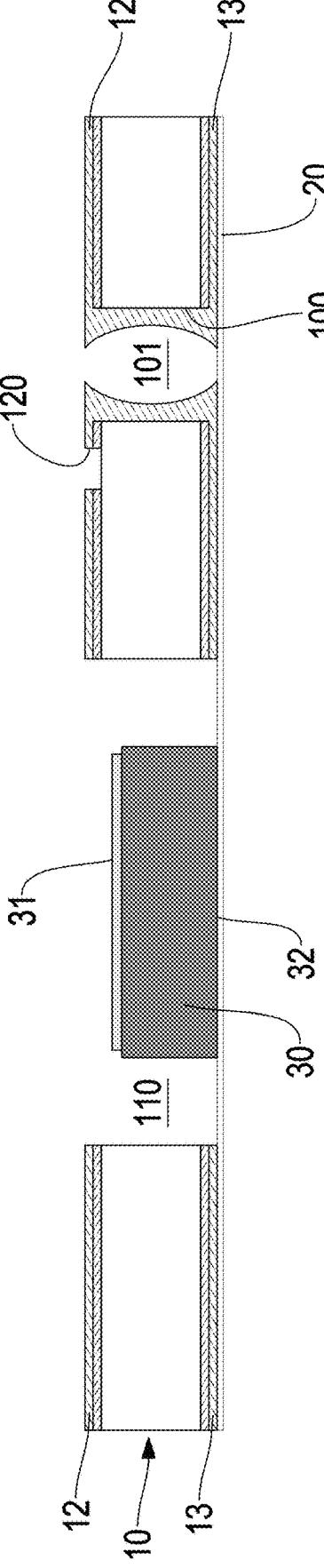
Figure 2F:
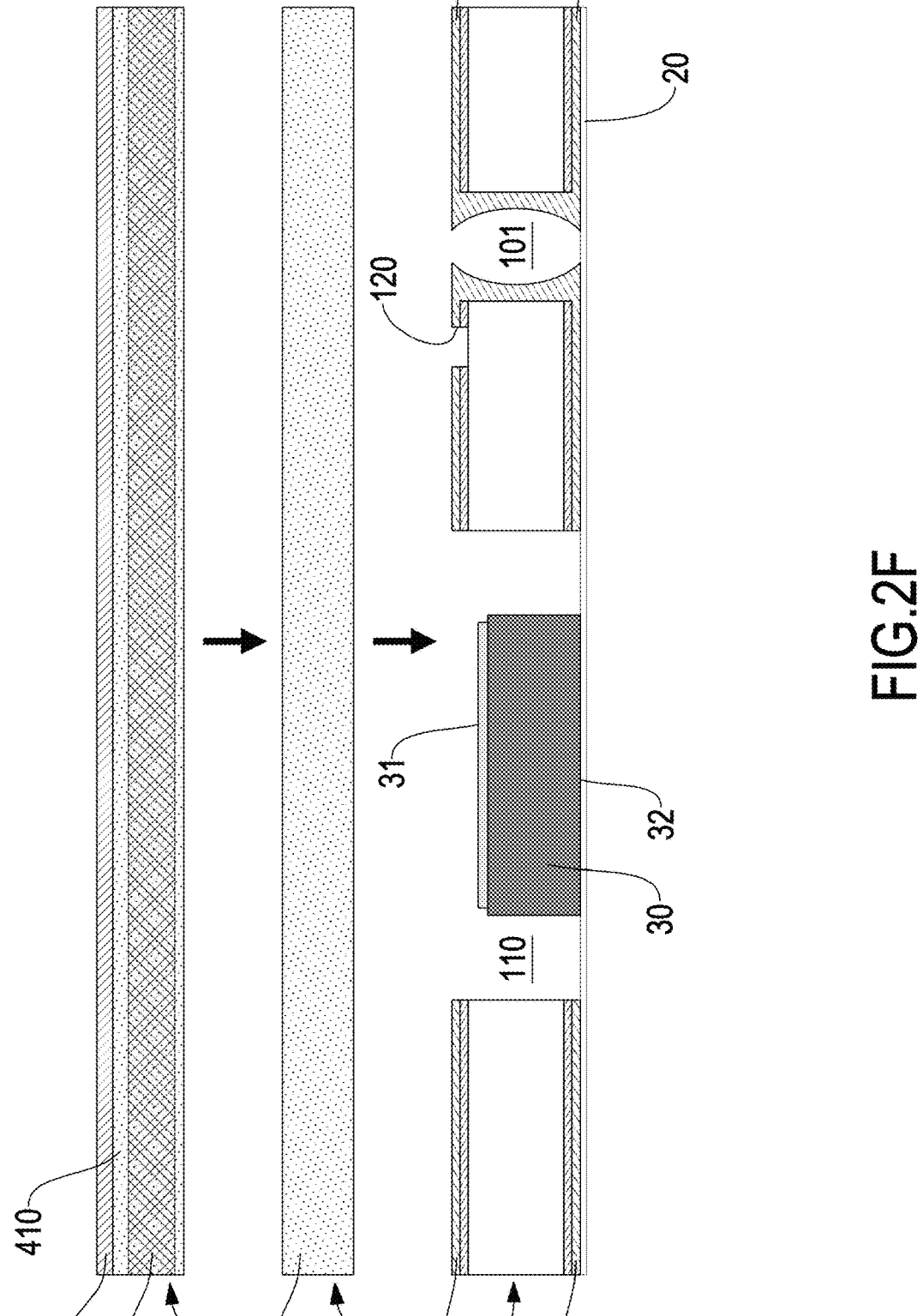
Figure 2G:
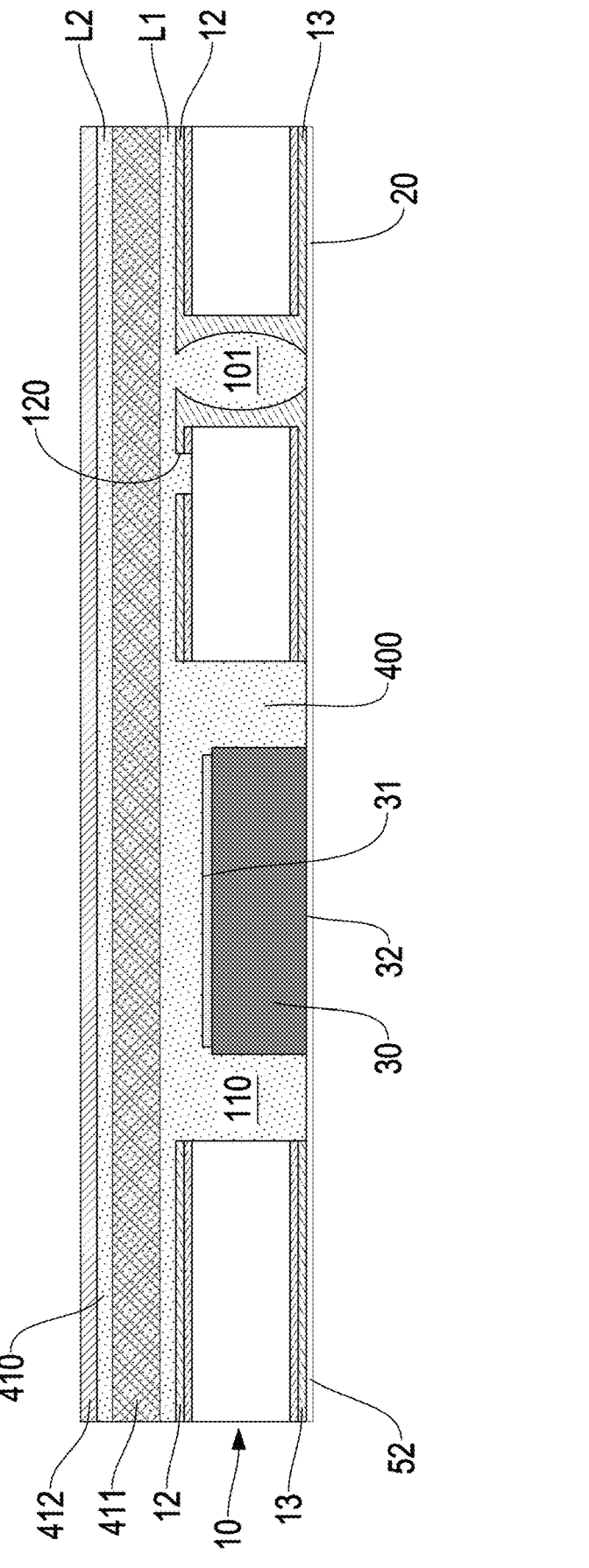
Figure 2H:
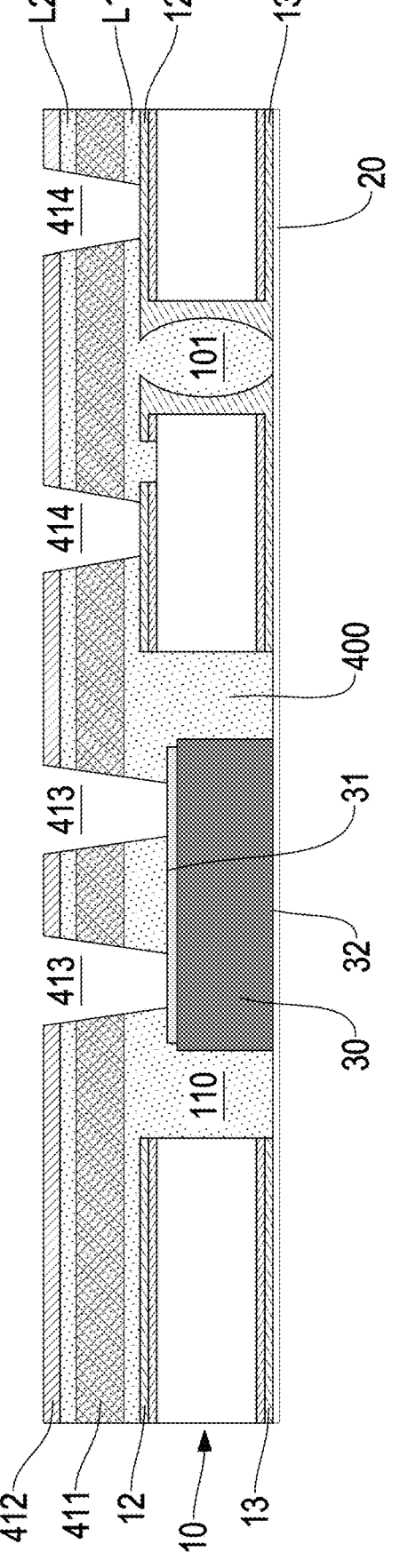
Figure 2I:
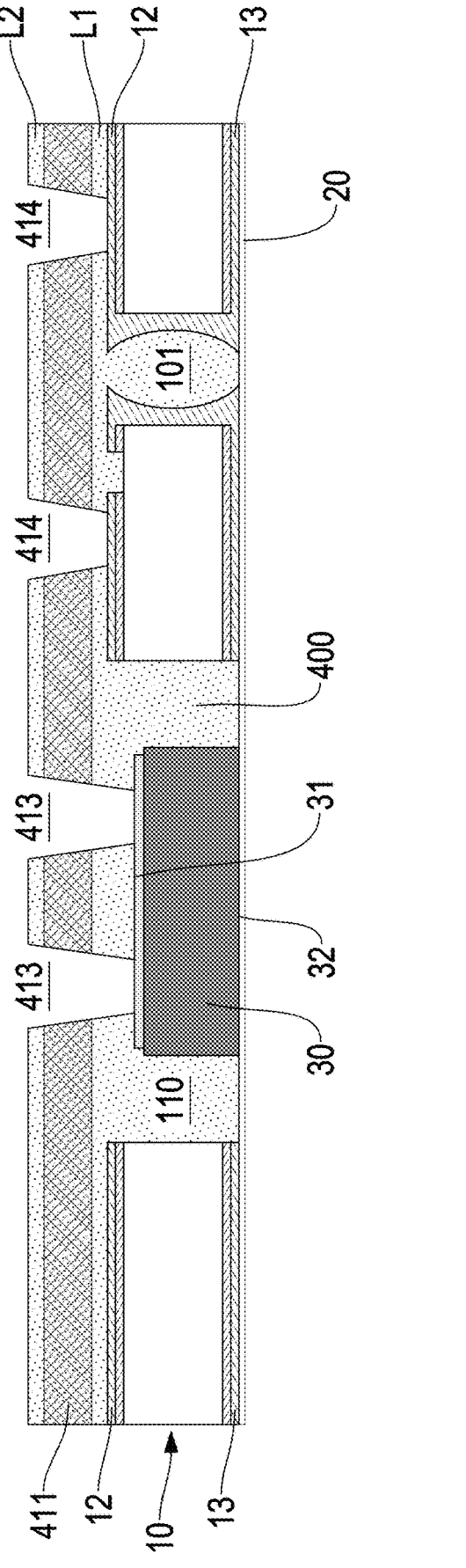
Figure 2J:
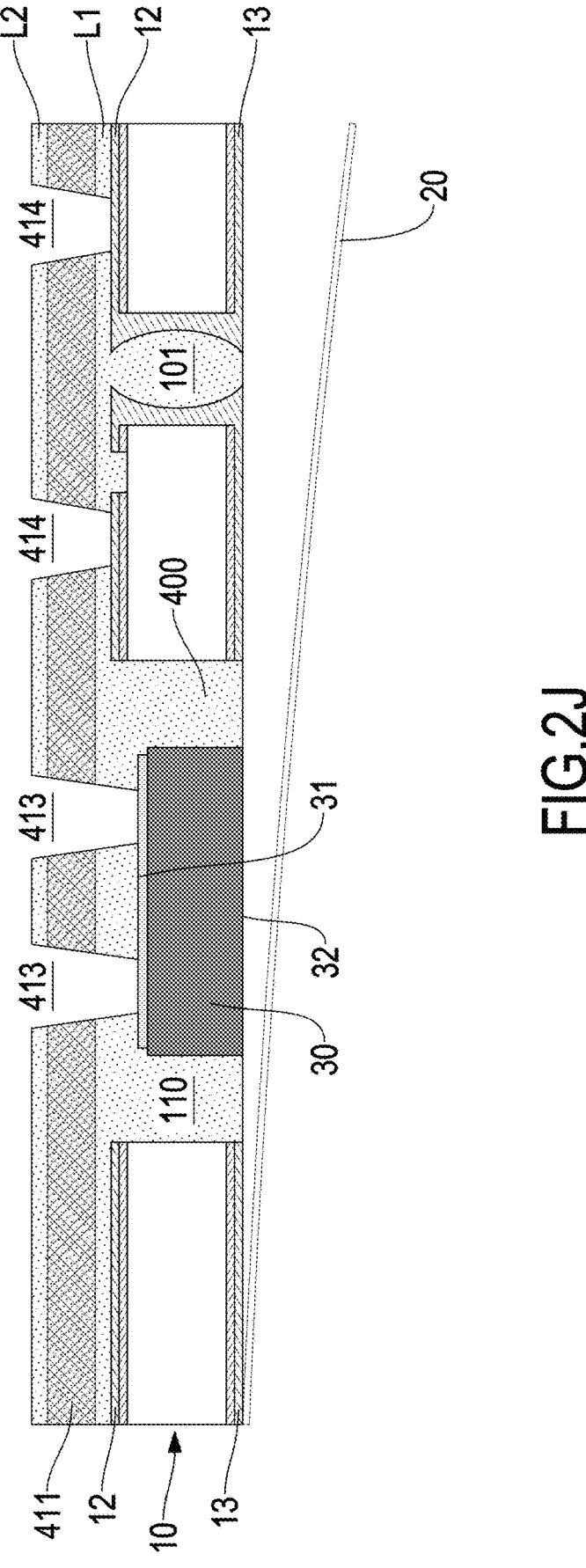
Figure 2K:
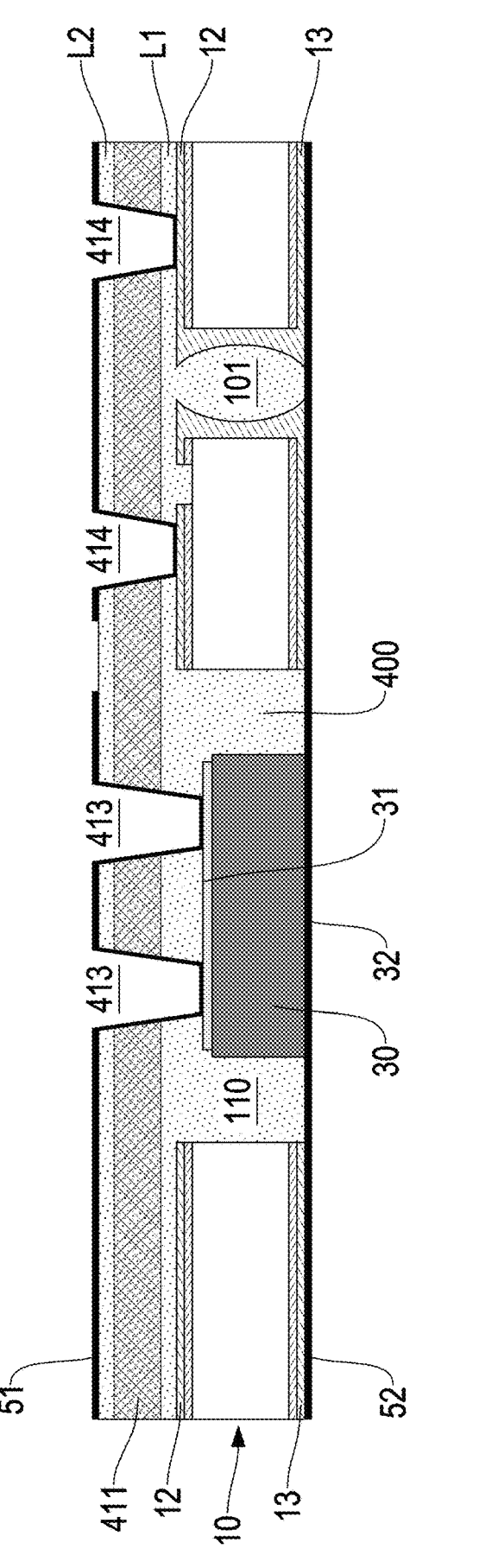
Figure 2L:
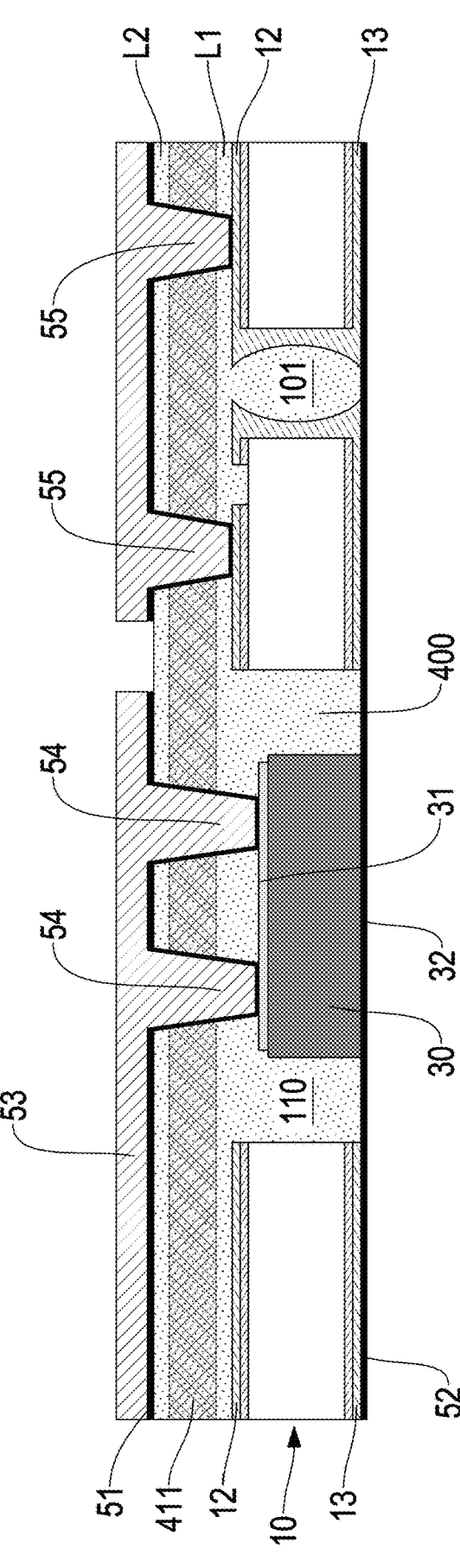
Figure 2M:
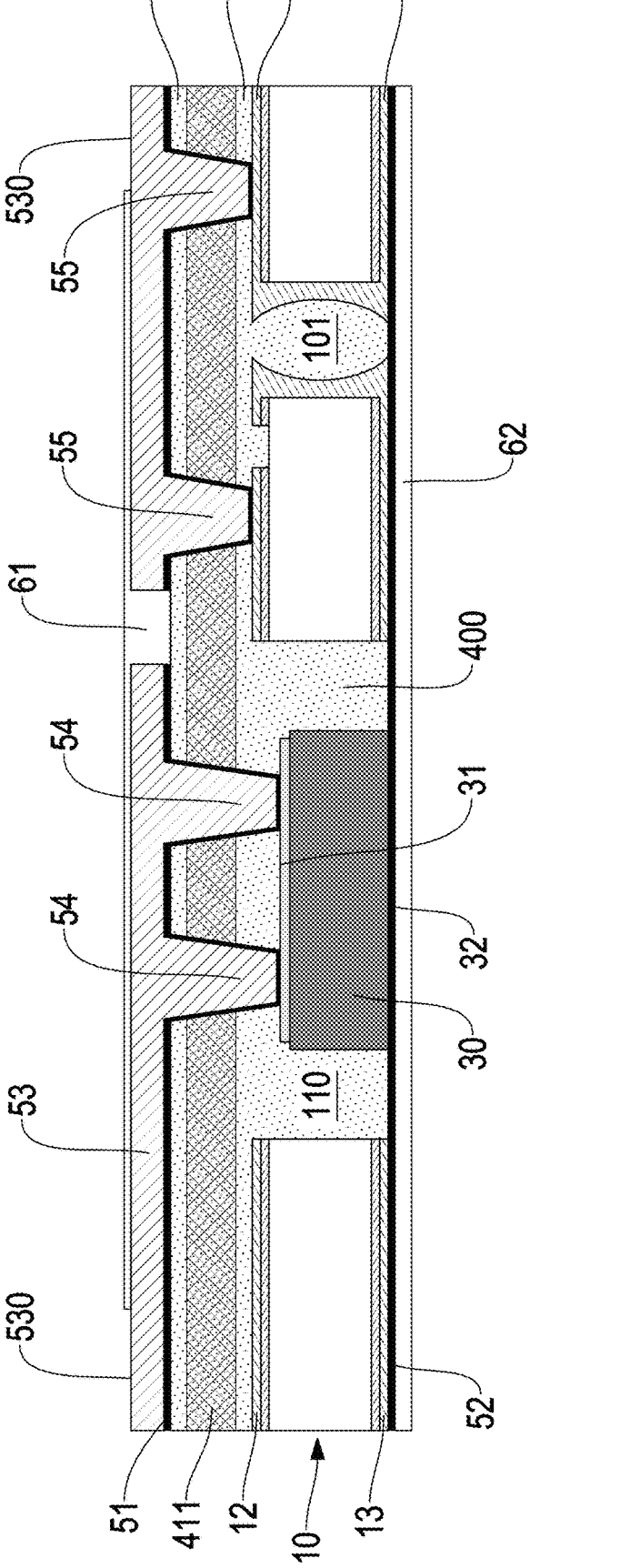
Figure 2N:
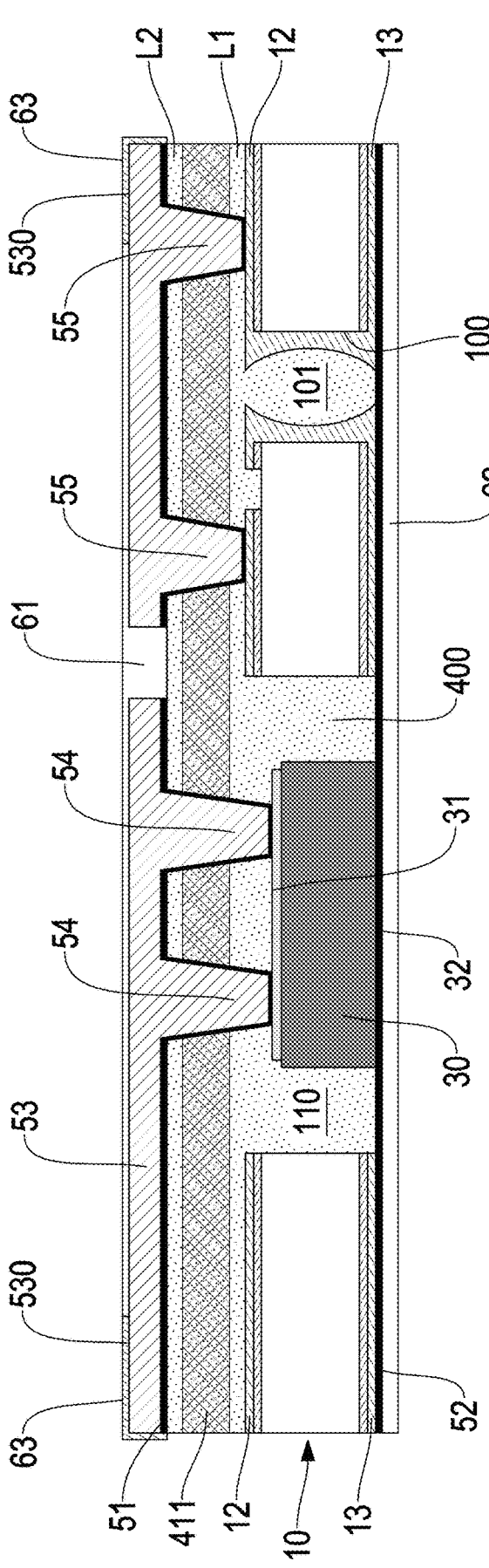

FIGS. 2A to 2N are schematic views of packaging processes of a first embodiment of the package of the present invention. Referring to FIG. 2A, a drilling process is performed on the composite substrate 10 to form at least one through hole 100, wherein techniques to form the at least one through hole 100 may be mechanical drilling, laser drilling, and so on.

Referring to FIG. 2B, then a metal deposition process is performed on the composite substrate 10 to form an upper conductive layer 12 and a lower conductive layer 13 on the upper metal sheet 11A and the lower metal sheet 11B of the composite substrate 10 respectively. Specifically, the metal deposition process is an electro-less plating process, an electroplating process or any other plating process to respectively deposit a metal (such as copper) on the upper metal sheet 11A and the lower metal sheet 11B of the composite substrate 10 to form the upper conductive layer 12 and the lower conductive layer 13. Wherein, a sum of a thickness of the composite substrate 10, a thickness of the upper conductive layer 12 and a thickness of the lower conductive layer 13 is defined as a substrate thickness T0, and the substrate thickness T0 is preferably greater than or equal to 210 micrometers.

In addition, the upper conductive layer 12 and the lower conductive layer 13 respectively have different conductive patterns. For example, an alignment mark 120 is formed on the upper conductive layer 12. The alignment mark 120 can be used for identification in subsequent processes, such as an automatic optical inspection (AOI) machine performing position calibration through the alignment mark 120 to place a die accurately in the composite substrate 10, wherein the alignment mark 120 may be an alignment hole.

During the metal deposition process of the composite substrate 10, the metal is also deposited on an inner wall of the at least one through hole 100, so that the at least one through hole 100 becomes at least one conductive via 101. For example, the at least one conductive via 101 may be at least one plating through hole (PTH). The at least one conductive via 101 is electrically connected to the upper conductive layer 12 and the lower conductive layer 13. During the metal deposition process of the at least one through hole 100, metal ions are easier to accumulate at openings located at both ends of the at least one through hole 100 than inside the at least one through hole (due to characteristics of charge accumulating at sharp points). As a result, an inner diameter of the openings located at both ends of the at least one conductive via 101 is smaller than an inner diameter of a central position of the at least one conductive via 101.

Referring to FIGS. 2C and 2D, the composite substrate 10 after the metal deposition process is drilled again to form an accommodating space 110 that is formed through the composite substrate 10, and an adhesive film 20 is attached to the lower conductive layer 13 to seal a bottom of the accommodating space 110. Referring to FIG. 2E, a die 30 is mounted on the adhesive film 20 and within the accommodating space 110. The die 30 has a first surface 31 and a second surface 32 opposite to each other. The first surface 31 is located on a top of the die 30 and exposed from the accommodating space 110, and the second surface is fixed on the adhesive film 20.

Referring to FIG. 2F, a first insulating sheet 40 and a second insulating sheet 41 are sequentially stacked on the upper conductive layer 12. Specifically, the first insulating sheet 40 is composed of a first insulating material 400, and the second insulating sheet 41 includes a second insulating material 410, a support layer 411 and a metal foil 412. The support layer 411 is wrapped by the second insulating sheet 410, and the metal foil 412 covers the second insulating sheet 410 and the support layer 411. Wherein, both the first insulating material 400 and the second insulating material 410 are thermosetting materials, such as resin, unsaturated polyester resin, epoxy resin, phenol formaldehyde resin, or bismaleimide triazine resin (BT), and the support layer is mainly formed by interweaving glass fibers. That is to say, the support layer is a fiberglass layer. Specifically, the support layer 411 is a prepreg fiber layer. For example, the prepreg fiber layer may be a prepreg plastic sheet produced by an impregnation process that is to impregnate reinforcing materials (electronic-grade glass fiber cloth) with semi-curing (B-Stage) epoxy resin.

Referring to FIG. 2G, subsequently a lamination process is performed on the first insulating sheet 40 and the second insulating sheet 41 to form a molding layer. Specifically, the first insulating material 400 and the second material 410 will melt by heating into a semi-curing (flowable) state during the lamination process. The first insulating material 400 and the second insulating material 410 form the molding layer together. The first insulating material 400 flows into and fills the at least one conductive via 101 and the accommodating space 110, so that the die 30 is wrapped by the first insulating material 400, and the upper conductive layer 12 is covered by the first insulating material 400. Preferably, the alignment mark 120 is also filled with the insulating material 400. The second insulating material 410 covers the first insulating material 400, so that the support layer 411 is buried in the molding layer and located above the upper conductive layer 12.

A part of the molding layer between a bottom surface of the support layer 411 and the upper conductive layer 12 is defined as a first interval layer L1, and another part of the molding layer between a top surface of the support layer 411 and a top surface of the molding layer is defined as a second interval layer L2. The first interval layer L1 may be formed of the first insulating material 400, or may be formed of the first insulating material 400 and the second insulating material 410. The second interval layer L2 is formed of the second insulating material 410. The first interval layer L1 and the second interval layer L2 respectively have a first thickness and a second thickness, and the first thickness and the second thickness are greater than or equal to 5 micrometers. The first thickness is sufficient for a pure resin to fill the accommodating space 110 and the at least one conductive via 101 without forming bubbles, wherein the pure resin is the first insulating material 400, or the first insulating material 400 and the second insulating material 410. The second thickness is able to reduce occurrences of arc breakdown. A thickness of the support layer 411 is at least 10 micrometers to make an overall structure of the package more stable.

Referring to FIGS. 2H to 2L, FIGS. 2H to 2L are processes of forming a redistribution layer (RDL) on the molding layer. First, referring to FIG. 2H, a drilling process is performed on the metal foil 412 to form a plurality of holes. The plurality of holes include at least one first hole 413 and at least one second hole 414, and the at least one first hole 413 is adopted to expose a partial area of the first surface 31 of the die 30, and the at least one second hole 414 is adopted to expose a partial area of the upper conductive layer 12. Specifically, at least one first pad (not shown in figure) is formed on the first surface 31, and at least one second pad (not shown in figure) is formed on the upper conductive layer 12. The at least one first hole 413 is configured to expose the at least one first pad, and the at least one second hole 414 is configured to expose the at least one second pad. Wherein, the at least one first hole may be one first hole 413 or multiple first holes 413, and the at least one second hole may be one second hole 414 or multiple second holes 414.

When the drilling process is completed, a plasma etching process is performed on the plurality of holes to remove debris residues produced during the drilling process, wherein shapes of the plurality of holes can be further determined by controlling a time duration of the plasma etching. In this embodiment, the plurality of holes are gradually tapered along the top surface of the molding layer toward the composite substrate and are in the shape of inverted cones. That is to say, an inner diameter of each hole gradually becomes smaller along the top surface of the molding layer toward the composite substrate 10.

Referring to FIG. 2I, the metal foil 412 shown in FIG. 2H is removed by an etching process to expose a top surface of the second interval layer L2 (the molding layer). Referring to FIG. 2J, the adhesive film 20 attached on the lower conductive layer 13 is removed to expose the lower conductive layer 13 and the bottom of the accommodating space 110 (the second surface 32 of the die 30). Referring to FIG. 2K, an electro-less plating process is performed on the top surface of the second interval layer L2 (the molding layer) and an inner wall of the plurality holes to form a top seed layer 51, and the electro-less plating process is also performed on the lower conductive layer 13 and the bottom of the accommodating space 110 (the second surface 32 of the die 30) to form a bottom seed layer 52. Wherein, because the shapes of the plurality of holes are in the shape of inverted cones, the top seed layer 51 can also be formed by a sputtering process.

Referring to FIG. 2L, a connecting metal is deposited on the top seed layer 51, so that the top seed layer 51 and a connecting metal layer 53 are stacked on the top surface of the second interval layer L2. The connecting metal is also deposited on the top seed layer 51 in the plurality of holes, so that the at least one first hole 413 is filled with the top seed layer 51 and the connecting metal to become at least one die connecter 54. The at least one second hole 414 is filled with the top seed layer 51 and the connecting metal to become at least one substrate connecter 55. The at least one die connecter 54 is electrically connected to the connecting metal layer 53 and the first surface 31 of the die 30 (the at least one first pad), and the at least one substrate connecter 55 is electrically connected to the connecting metal layer 53 and the upper conductive layer 12 (the at least one second pad). In this embodiment, shapes of the at least one die connecter 54 and the at least one substrate connecter 55 are gradually tapered along the top surface of the molding layer toward the composite substrate. Wherein the redistribution layer includes the top seed layer 51, the connecting metal layer 53, the at least one die connecter 54, and the at least one substrate connecter 55.

Referring to FIG. 2M, the connecting metal layer 53 (the redistribution layer) is covered by a top protective layer 61. A partial area of the connecting metal layer 53 is exposed to form at least one surface pad 530. The bottom seed layer 52 is covered by a bottom protective layer 62. For example, the top protective layer 61 and the bottom protective layer 62 may respectively be a top solder mask and a bottom solder mask. Referring to FIG. 2N, finally, a surface finishing process is performed to form a surface metal layer 63 on the at least one surface pad 530. The surface layer 63 is electrically connected to the first surface 31 of the die 30 (the at least one first pad) through the connecting metal layer 53 and the at least one die connecter 54, or the surface layer 63 is electrically connected to the upper conductive layer 12 (the at least one second pad) through the connecting metal layer 53 and the at least one substrate connecter 55.

Figure 3C:
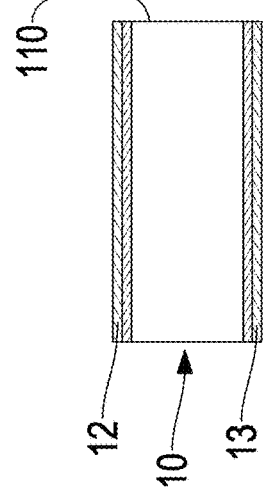
FIGS. 3A to 3N are schematic views of packaging processes of a second embodiment of the package of the present invention.
Figure 3D:
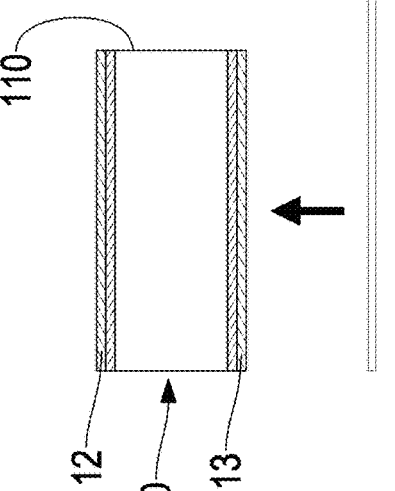
Figure 3E:
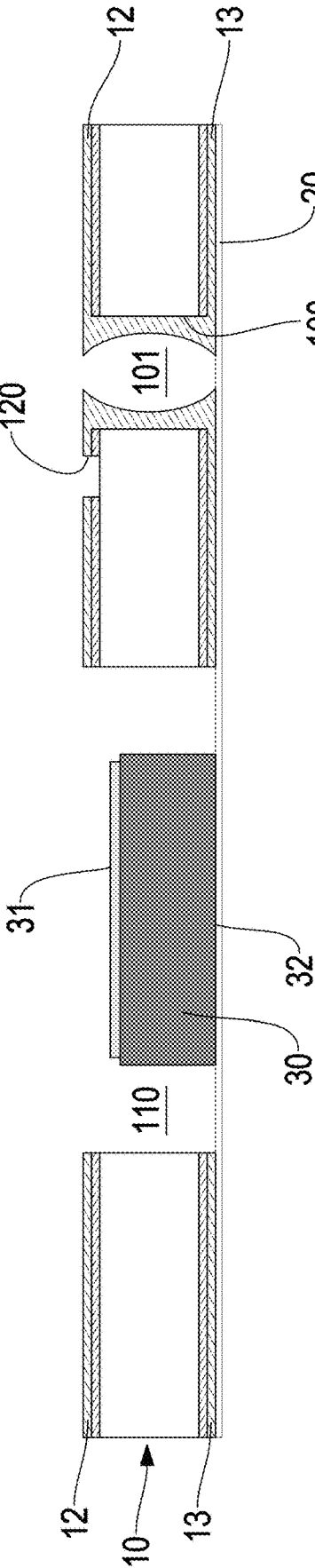
Figure 3F:
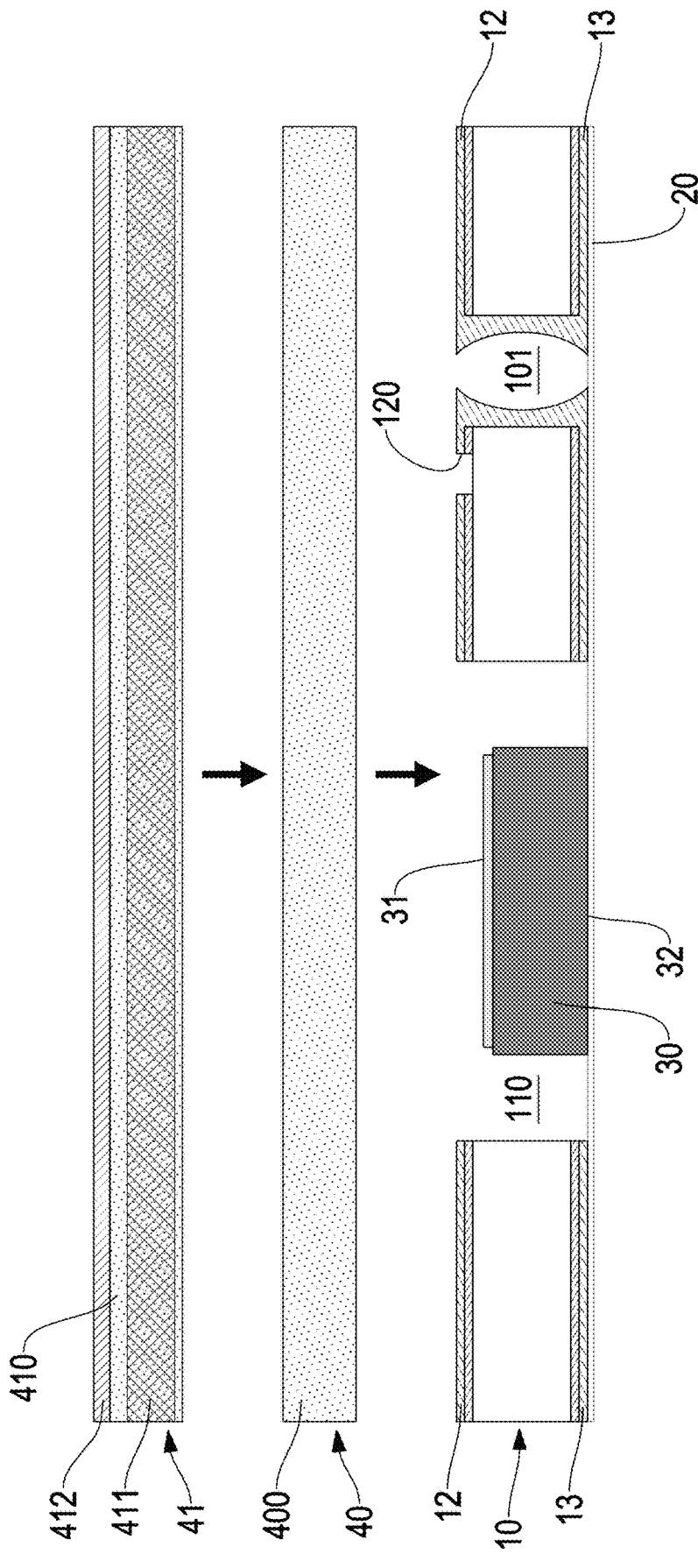
Figure 3G:
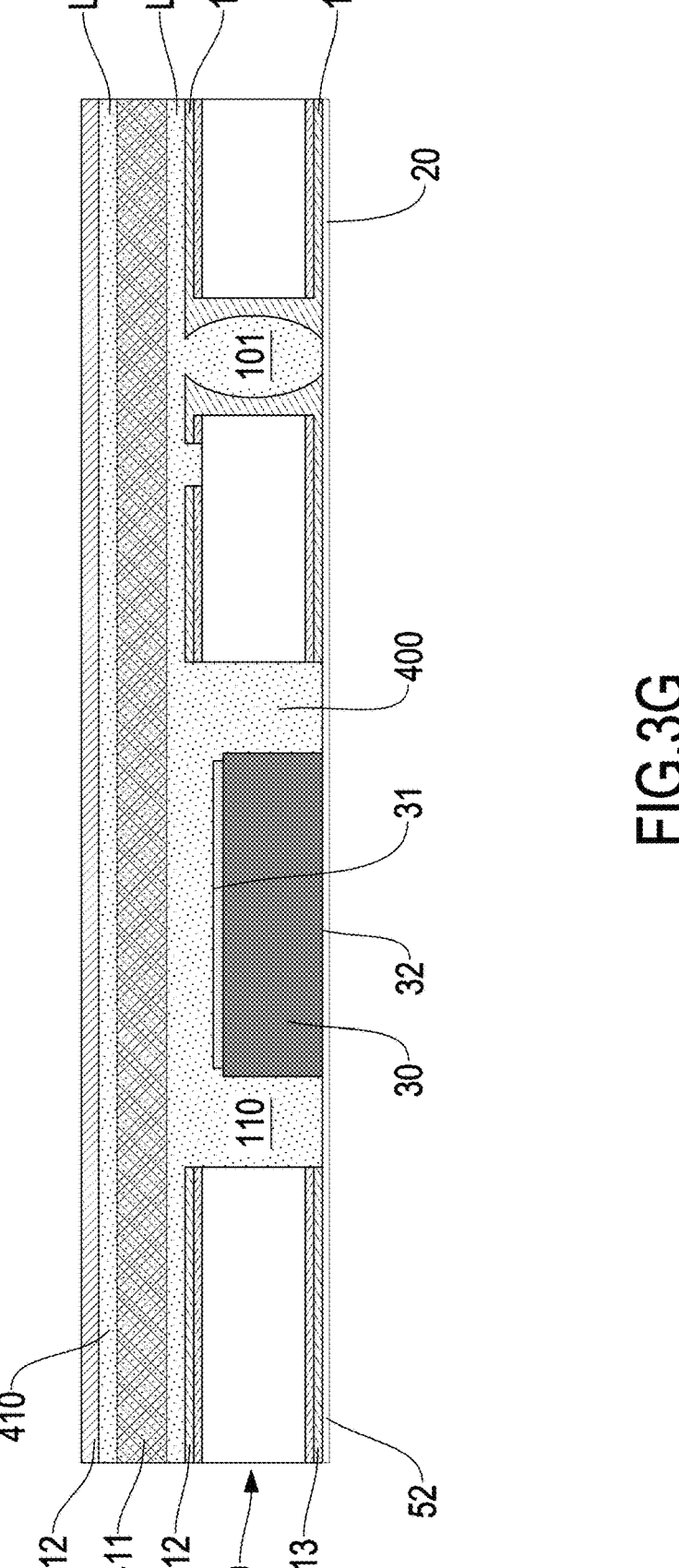

After completing the processes shown in FIGS. 2A to 2N, a first embodiment of the package of the present invention is formed (referring to FIG. 2N). The package of the present invention also has a second embodiment. Referring to FIGS. 3A to 3N, FIGS. 3A to 3N are schematic views of packaging processes of a second embodiment of the package of the present invention, wherein the processes in FIGS. 3A to 3G are exactly same as the processes in FIGS. 2A to 2G and will not be repeated. A difference between the second embodiment and the first embodiment of the package processes of the package of the present invention is process shown in FIG. 3H.

Figure 3H:
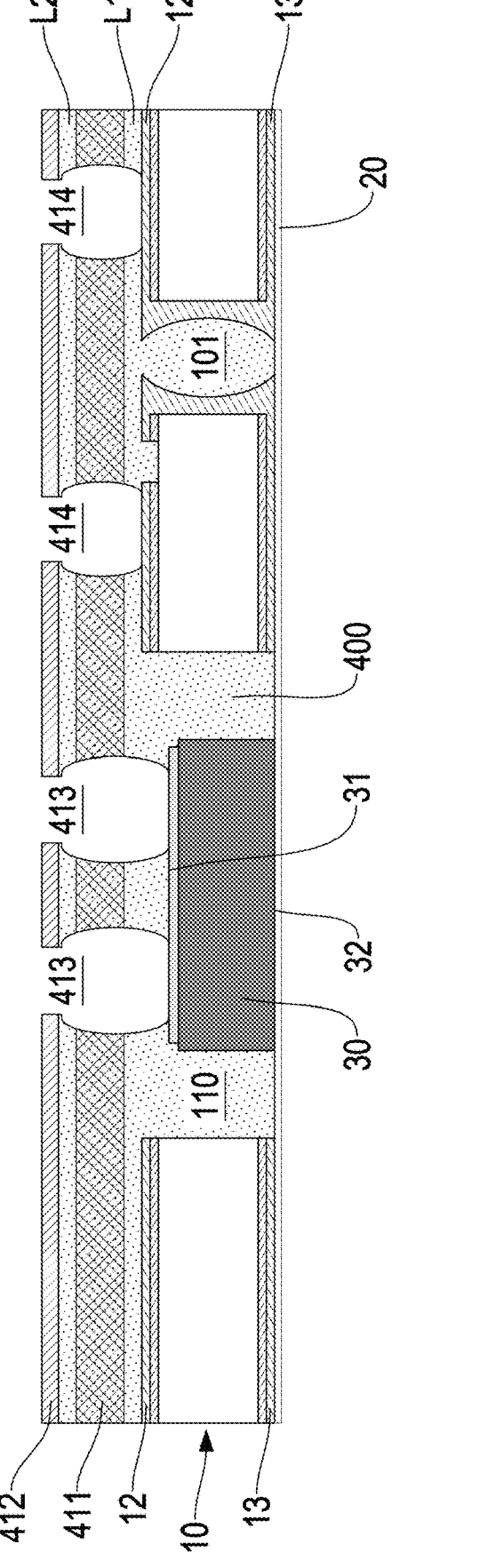
Figure 3I:
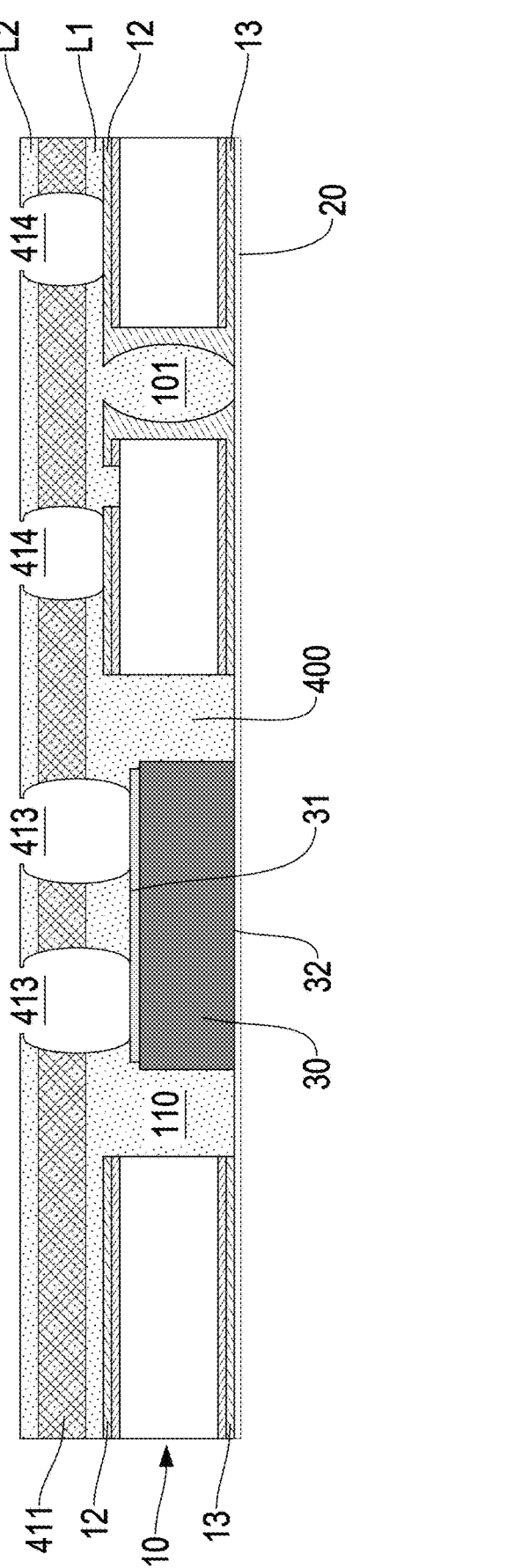
Figure 3J:
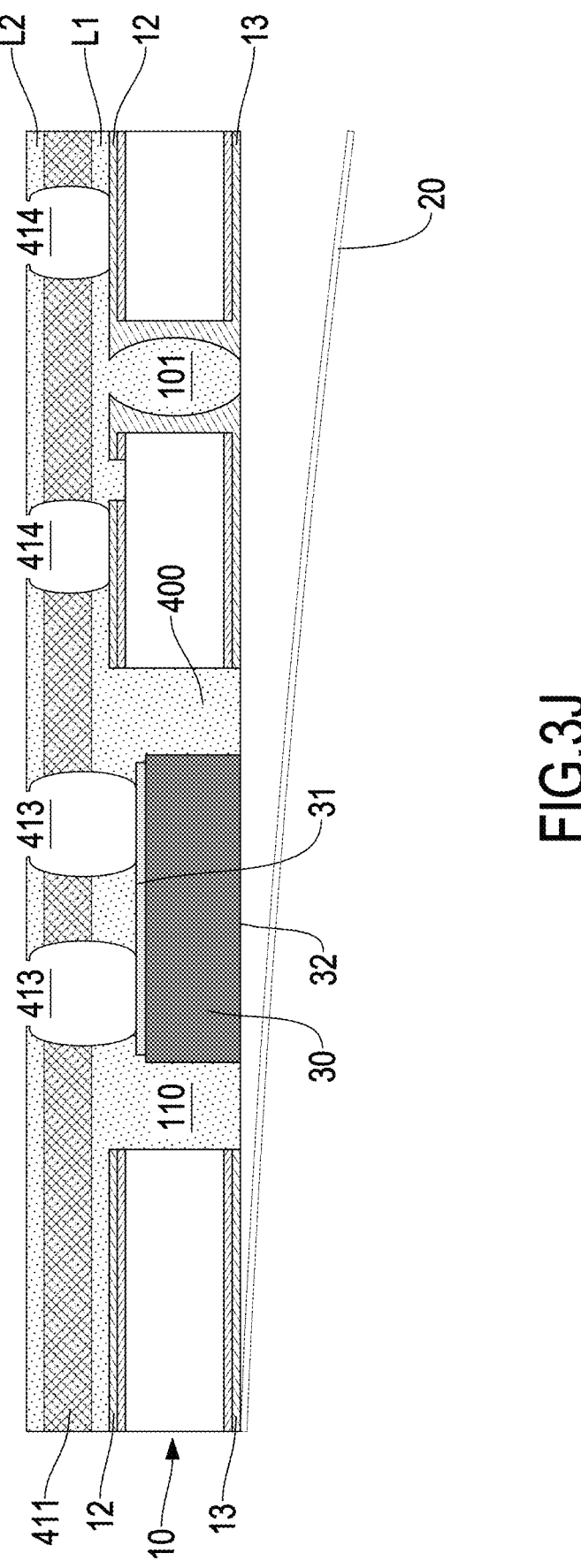
Figure 3K:
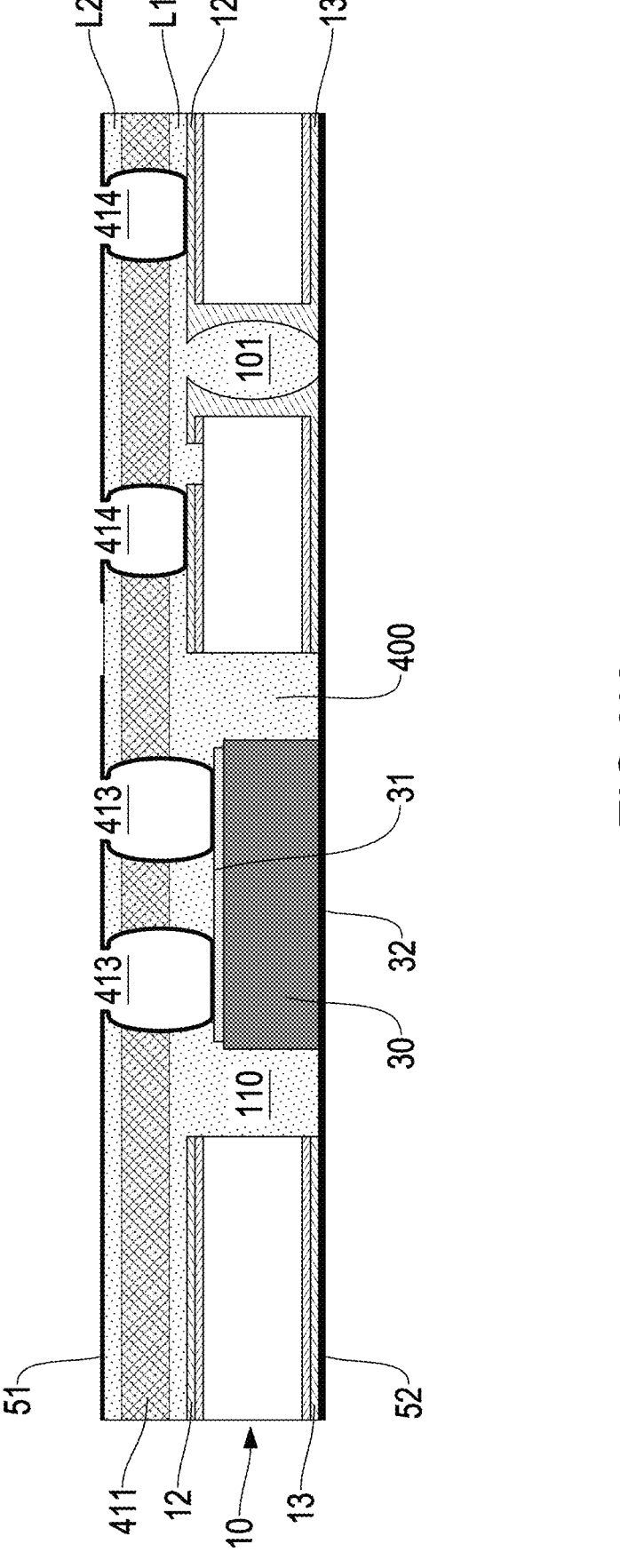
Figure 3L:
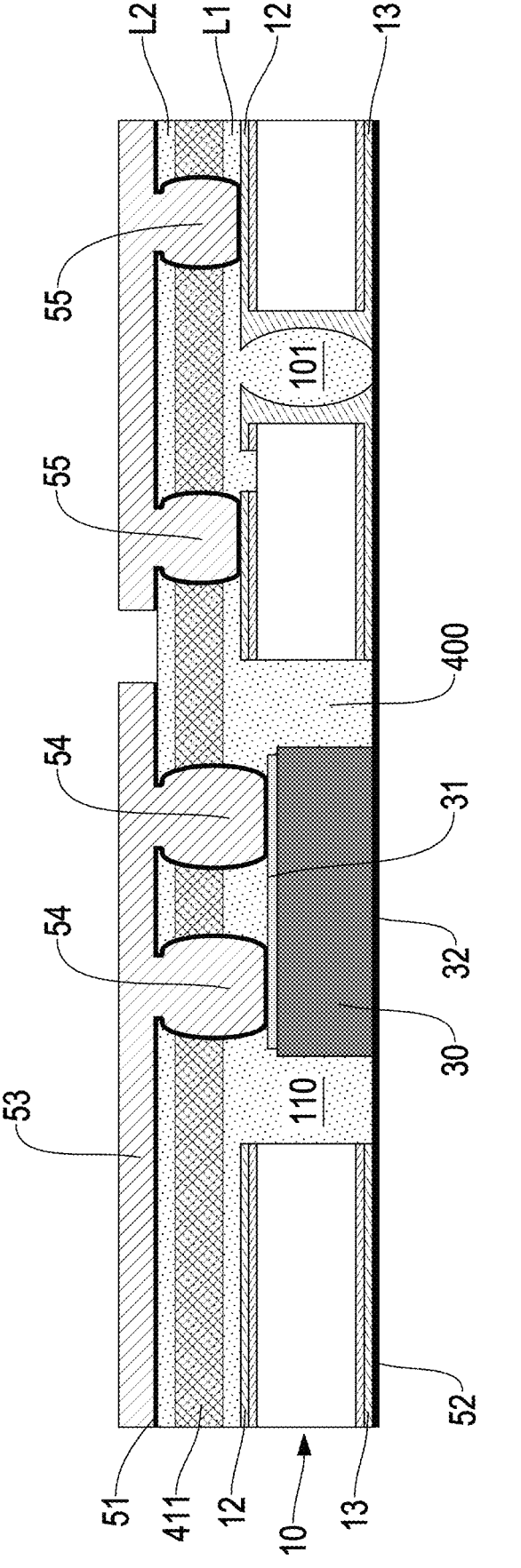
Figure 3M:
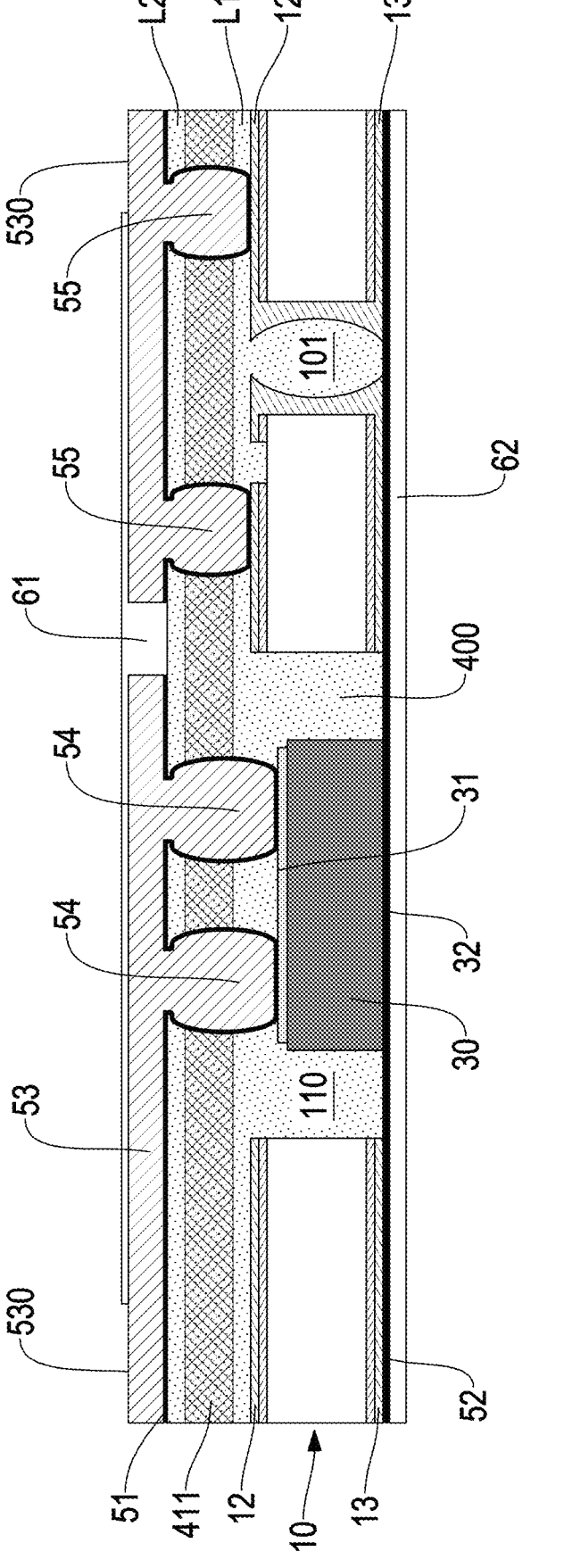
Figure 3N:
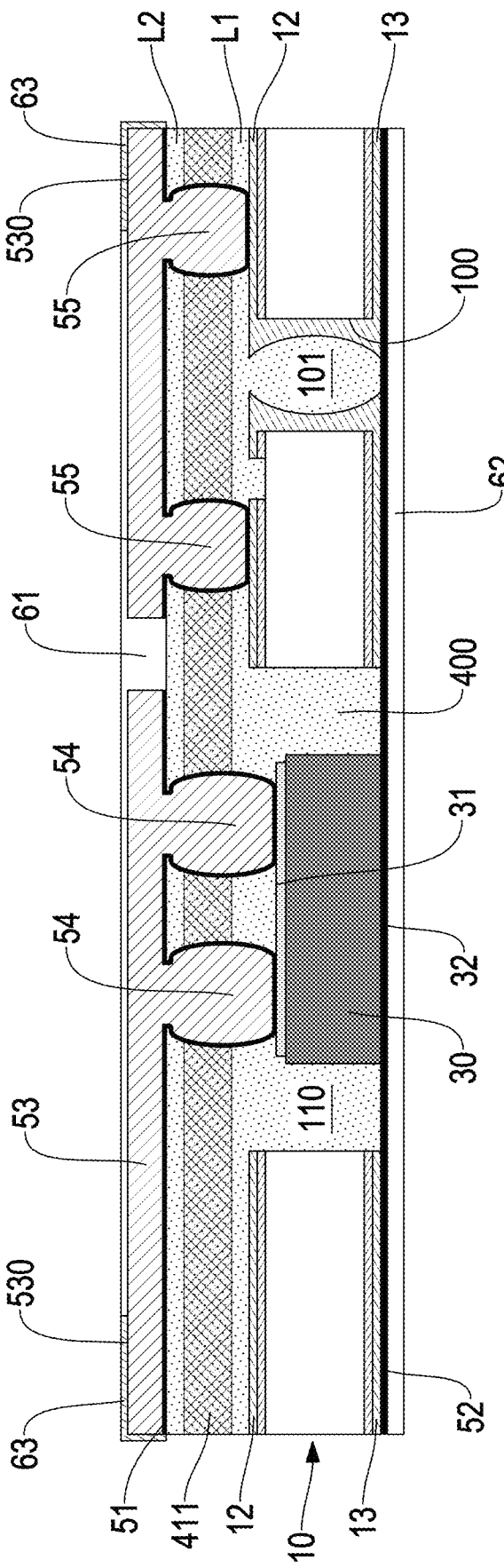

Referring to FIG. 3H, after the plurality of holes (including the at least one first hole 413 and the at least one second holes 414) are formed by a laser drilling process, a longer plasma etching process (compared to the plasma etching process of the first embodiment) is performed, such that each of the plurality of holes is in the shape of a cylinder. Diameters of two ends of the cylinder are smaller than a diameter of a central position of the cylinder, such that each of the plurality of holes is barrel-shaped, which means a central position of an inner wall of each one of the plurality of holes is concave with respect to two ends of each one of the plurality of holes. Processes shown in FIGS. 3I to 3J are same as the first embodiment of the present invention and will not be repeated. Another difference between the second embodiment and the first embodiment of the present invention is processes shown in FIG. 3K and FIG. 3L. Referring to FIG. 3K, when the top seed layer 51 is to be formed on the top surface of the second interval layer L2 and in the plurality of holes, because of the shape of the plurality of holes in this embodiment (barrel-shaped), the sputtering process is unable to be performed to form the top seed layer 51. Referring to FIG. 3L, the at least one die connecter 54 and the at least one substrate 55 are each a conductive pillar as said in the first embodiment, and because of shapes of the plurality of holes in this embodiment, diameters of two ends of the conductive pillar are smaller than a diameter of a central position of the conductive pillar. After completing the processes shown in FIGS. 3A to 3N, the second embodiment of the package of the present invention is formed (referring to FIG. 3N).

Figure 4:
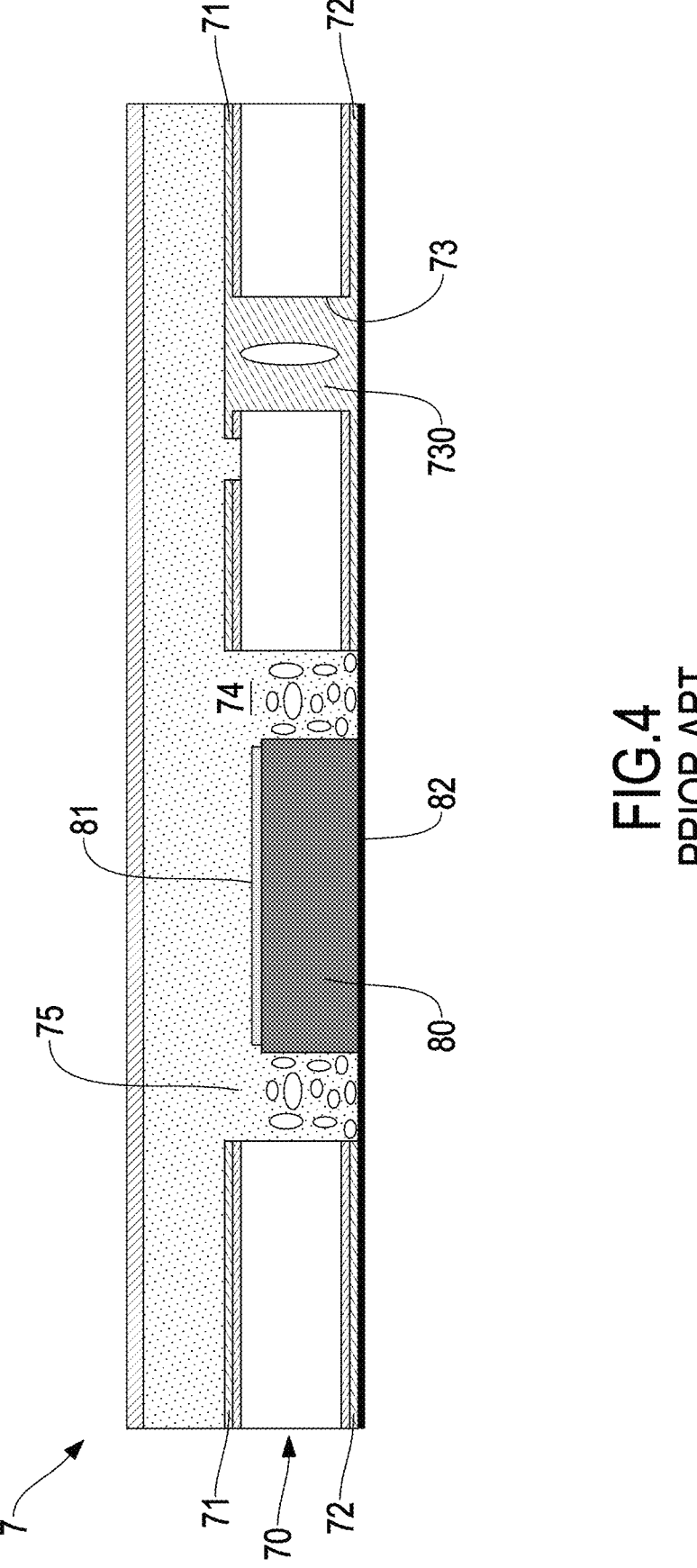
FIG. 4 is a cross-sectional view of a conventional package.

In the first embodiment and the second embodiment of the present invention, during the process of depositing a metal on the inner wall of the at least one through hole 100 to form the at least one conductive via, a metal deposition time is controlled to make two openings at two ends of the at least one conductive via 101 remain unsealed. Compared with the package 7 in the related art (referring to FIG. 4), the package of the present invention does not form a conductive pillar but forms the at least one conductive via 101, and the at least one conductive via 101 is filled with the molding layer, thereby reducing bubbles caused by inconsistent metal deposition rates during processes. When undergoing subsequent reliability testing, the present invention overcomes the air pressure issue generated by bubbles in the related art, increasing product reliability.

In addition, during the packaging processes of the package of the present invention, a step of setting a first insulating sheet 40 is added. The first insulating sheet 40 can be heat-melted to provide a sufficient amount of the first insulating material 400 to fill the accommodating space 110 and wrap the die 30, eliminating bubble formation adjacent to a periphery of the die 30 and reducing arcing phenomenon, and thereby stabilizing an electrical performance of the die 30 of the present invention. When the first insulating sheet 40 can provide the sufficient amount of the first insulating material 400, the substrate thickness T0 will be increased. An effect of increasing the substrate thickness T0 is that the accommodating space 110 can be relatively enlarged. As a result, a thickness of the die 30 will can be relatively increased. When the thickness of the die 30 is increased, the die 30 does not need to be thinned in a manufacturing process of the die 30, thereby increasing a product yield of the die 30 or a sufficient space to design and layout integrated circuits of the die 30 in the manufacturing process of the die 30.

Furthermore, during the lamination process, a sufficient amount of the first insulating material 400 not only fills the at least one conductive via 101 and the accommodating space 110, but also forms the first interval layer with a thickness on the upper conductive layer 12. That is to say, the first insulating material 400 forms the first interval layer L1, or the first insulating material 400 and the second insulating material 410 jointly form the first interval layer L1. The first interval layer L1 has a sufficient thickness (the first thickness is greater than or equal to 5 micrometers) and is located at a bottom of the support layer 411, so that the second insulating material 410, originally located on a top of the support layer 411, can still remain, after heat-melted, on the top of the support layer 411 to form the second interval layer L2. When the second interval layer L2 has a sufficient thickness, the top of the support layer 411 can be covered to prevent the glass fibers in the support layer 411 from being exposed, thereby improving a plating ability of the top seed layer 511 (the top seed layer 511 is not easy to be plated on the glass fibers).

In a situation where a sufficient thickness exists between the upper conductive layer 12 and the connecting metal layer 53, when a high voltage flows through the upper conductive layer 12 or the connecting metal layer 53, the sufficient thickness can reduce occurrences of arc breakdown. That is to say, the sufficient thickness existing between the upper conductive layer 12 and the connecting metal layer 53 can improve a voltage withstand capability of the package of the present invention. Moreover, in the second embodiment of the package of the present invention, with the plurality of barrel-shaped holes, the connecting metal is not only deposited on the top seed layer 51 but also engaged in the plurality of holes and is less likely to loosen, thereby increasing a structural stability of the package of present invention.

The above only records the implementations or embodiments of the technical artifices adopted by the present invention to solve the problems, and is not configured to limit the claims of the present invention. That is, all equivalent changes and modifications that are consistent with the meaning of the claims of the present invention or made in accordance with the claims of the present invention are covered by the claims of the present invention.

What is claimed is:

1. A package capable of eliminating bubble formation, including:

a composite substrate having an accommodating space; wherein a top surface and a bottom surface of the composite substrate respectively have an upper conductive layer and a lower conductive layer;

at least one conductive via formed in the composite substrate and electrically connected to the upper conductive layer and the lower conductive layer;

a die mounted in the accommodating space and having a first surface and a second surface opposite to each other;

a molding layer covering the composite substrate and filled in the at least one conductive via and the accommodating space to wrap the die;

a support layer buried in the molding layer and located above the upper conductive layer, wherein a thickness of the support layer is at least 10 micrometers;

a part of the molding layer between a bottom surface of the support layer and the upper conductive layer is defined as a first interval layer;

another part of the molding layer between a top surface of the support layer and a top surface of the molding layer is defined as a second interval layer; and a thickness of each of the first interval layer and the second interval layer is at least 5 micrometers; and a redistribution layer mounted on the molding layer and electrically connected to the first surface of the die and the upper conductive layer;

wherein the molding layer is formed by laminating a first insulating sheet and a second insulating sheet; the support layer is comprised in the second insulating sheet; and the first insulating sheet and the second insulating sheet are heated to a semi-curing state to flow into and fill the at least one conductive via and the accommodating space.

2. The package as claimed in claim 1, wherein the molding layer includes multiple first holes and multiple second holes; the multiple first holes expose a partial area of the first surface of the die; and the multiple second holes expose a partial area of the upper conductive layer.

3. The package as claimed in claim 2, wherein the multiple first holes and the multiple second holes are each formed in an inverted cone shape.

4. The package as claimed in claim 2, wherein a central position of an inner wall of each one of the multiple first holes and the multiple second holes is concave with respect to two ends of each one of the multiple first holes and the multiple second holes.

5. The package as claimed in claim 1, wherein the support layer is a fiberglass layer.

6. The package as claimed in claim 1, wherein the molding layer is selected from a group consisting of an unsaturated polyester resin layer, an epoxy resin layer, a phenol formaldehyde resin layer and a bismaleimide triazine resin layer.

7. The package as claimed in claim 1, wherein a total thickness of the composite substrate, the upper conductive layer, and the lower conductive layer is greater than or equal to 210 micrometers.

8. The package as claimed in claim 1, wherein an inner diameter of each of two openings located at both ends of the at least one conductive via is smaller than an inner diameter of a central position of the at least one conductive via.

9. The package as claimed in claim 1, further including:

a top protective layer covering the redistribution layer and exposing a partial area the redistribution layer to form at least one surface pad;

a bottom protective layer covering the second surface of the die and the lower conductive layer;

a bottom seed layer mounted between the bottom protective layer and the second surface of the die, and between the bottom protective layer and the lower conductive layer; and a surface metal layer mounted on the at least one surface pad.

10. The package as claimed in claim 1, wherein the redistribution layer has at least one die connecter and at least one substrate connecter; the at least one die connecter electrically contacts the first surface of the die; the at least one substrate connecter electrically contacts the upper conductive layer; and shapes of the at least one die connecter and the at least one substrate connecter are gradually tapered along the top surface of the molding layer toward the composite substrate.

11. The package as claimed in claim 1, wherein the redistribution layer has at least one die connecter and at least one substrate connecter; the at least one die connecter electrically contacts the first surface of the die; the at least one substrate connecter electrically contacts the upper conductive layer; each of the at least one die connecter and the at least one substrate connecter is a conductive pillar; and diameters of two ends of the conductive pillar are smaller than a diameter of a central position of the conductive pillar.

* * * * *